DIFFERENTIAL DIRECT-COUPLED AMPLIFIER ARRANGEMENTS

Filed Feb. 17, 1965 Sheet 1 of 2

INVENTORS
NEWTON E. BALL
GARRY C. GILLETTE
BY
Fraser and Bogucki
ATTORNEYS

INVENTORS
NEWTON E. BALL
GARRY C. GILLETTE
BY Fraser and Bogucki
ATTORNEYS

United States Patent Office 3,448,398

Patented June 3, 1969

3,448,398

DIFFERENTIAL DIRECT-COUPLED AMPLIFIER ARRANGEMENTS

Newton E. Ball, Claremont, and Garry Carter Gillette, Costa Mesa, Calif., assignors to Neff Instrument Corporation, a corporation of Delaware Filed Feb. 17, 1965, Ser. No. 433,265
Int. Cl. H03f *1/00, 1/14*
U.S. Cl. 330—69 9 Claims

ABSTRACT OF THE DISCLOSURE

Direct-coupled amplifier configurations exhibiting a high common mode rejection capability for electrical signals which is realized by the maintenance of the input terminals of the amplifier stages isolated with respect to a reference potential.

The subject invention relates to improved electrical signal amplifiers, and more particularly to a wide band, direct coupled electrical signal amplifier of the differential type exhibiting a high common mode rejection capability, and capable of operation from zero frequency (D.C.) to a relatively high frequency.

In the sensing of physical phenomena by transducers, such as strain gauges, accelerometers and the like, it is often necessary to amplify the resulting electrical signals which are analogs of the sensed phenomena. Such amplification is frequently required in order to obtain a signal of a level usable by signal utilizing apparatus such as electrical recording or indicating apparatus. Also, electrical signal amplifying equipment is often required in order to provide impedance-matching or impedance isolation between the transducer and the signal utilizing means, whereby the impedance characteristics of one will not adversely affect the accuracy or performance of the other.

Often because the signal amplifying apparatus (amplifier) cannot tolerate the environment at the transducer, or because no installation space or power exists at the transducer location or for other reasons the transducer must be connected to the amplifier input by long wires or cables. It should be pointed out here that it is impracticable to maintain two distant points at the same electrical potential, especially if the area between and around the two points is being used for the transmission of electrical power and the operation of electrical apparatus. Any attempt to maintain the two points at the same potential by connecting them with an electrical conductor, as a wire or bus bar, is subject to the following limitations.

The wire is a conductor in a changing and alternating magnetic field, and a potential difference between its end points will be induced according to the well-known laws of magnetic induction.

The wire will have along its length a finite though small impedance. Any current flowing in the wire will result in a corresponding potential drop whose magnitude is the product of the current and the impedance. This effect is also well known. Thus any source of current in the wire is a source of potential difference between its end terminals. As an example, a source of such currents may be capacitive coupling from the wire or a portion thereof to any source of alternating or changing potential such as a power line or electrical circuit wherein transient voltages, such as switching spikes, exist.

For electromagnetic radiation of any frequency high enough so that the length of the wire is a non-negligible portion of a wave length, the wire will act as an antenna or pickup lead unless it is effectively shielded from such radiation. To the extent that this condition of an unshielded conductor in an electromagnetic field exists, potential differences along the wire and between its end points at the frequency of the electromagnetic radiation will exist.

For numerous reasons inherent in the design of transducers it is frequently desirable and sometimes necessary that the potential between the active element of the transducer and its case or structure (transducer ground) be minimal. Thus one of the signal leads of the transducer is often connected to this transducer ground.

Similarly and for the additional consideration of operator safety it is frequently the case that one of the signal terminals of a signal voltage display or recording device is connected to its case or mounting structure (load ground).

Because these two "grounds" are remote from each other, and for the reasons given above, there inevitably exists a difference in potential between them. This potential is typically several volts in amplitude and random in waveform and frequency. The purpose of the cable connecting a transducer to an amplifier is to transmit the potential difference at the transducer output terminals, which is signal analogous to the measured function, to the amplifier input terminals without allowing this signal to be influenced by the ground difference. Such a cable also must prevent sources of interference in the area it traverses from interfering with the signal voltage. This has been attempted in prior art arrangements by employing a difference amplifier with dual input terminals and causing the magnetically induced voltages on the two signal wires to be identical so that the induced voltages like the ground potential difference, appears in common along both signal wires and not as a difference between them. Physically this may be accomplished by making the two conductors a twisted pair. In addition, the signal wires may be shielded from unwanted capacitive effects by surrounding them with a shield which is terminated to the transducer ground. This shield is usually copper rather than iron and does not minimize magnetic induction.

The result of the transmission by such a cable is that at the amplifier input terminals a considerable extraneous voltage (called a common mode voltage) appears in common on both inputs to the signal amplifier. This voltage is the series sum of the ground potential difference and the commonly induced voltage in the signal cable. The purpose of the amplifier is to extract the small difference voltage (typically a few millivolts), amplify it and present it for display at its output terminals, one of which is connected to load ground, while preventing any output due to the extraneous common mode voltage.

It should be noted that only when the zero frequency (D.C.) component of the signal is important does the problem become difficult. For any other signal a shielded signal tarnsformer does an adequate job of presenting an output that is sensitive to differential voltage and insensitive to common mode voltage.

One general approach to the problem of reducing amplifier response to a common mode voltage involves the use of a single-ended, floating direct-coupled amplifier with one input terminal common to one output terminal. This requires the load or output device to have no connection between either of its input terminals and its case or mounting structure. The limitation of this approach is that many signal-utilizing and recording devices which are to be coupled to the output of the amplifier do not meet this requirement.

Where signal considerations permit its use, the narrow band direct-coupled amplifier, such as that described in the Neff Patent 2,832,848, exhibits excellent common mode rejection. The problem with narrow band amplifiers is that while transducers and signal utilizing devices are both capable of frequency response from zero frequency (D.C.) to several kilocycles per second, the bandwidth of the amplifier, typically about one hundred cycles per second, limits the performance of the system.

Wide band differential amplifiers using balanced bridge-type circuitry have been developed. Some amplifiers of this type exhibit a low input impedance to common mode signals, but the operation of these amplifiers is critical since they require that the impedance of the transducer be constant and that an adjustment of the amplifier be made after connection to a particular transducer. Such an amplifier configuration is described in an article entitled "Wide Band Differential Amplifier" by S. C. Brown in Electrical Design News (January-February 1961). Another amplifier of this general type is described in the Bell Patent 3,089,097, but this is known to be limited by its inherent low common mode impedance. While the described amplifier configuration of Brown does not suffer from the effects of a low common mode impedance, it requires matched components for proper operation and therefore is costly to build and subject to drift during use. All amplifiers of this type are limited in their performance to some extent by the degree of matching of electrical components that can be achieved and maintained. The required balancing of components is both expensive and difficult to achieve.

Accordingly, it is an object of the present invention to provide an improved signal amplifying configuration.

It is another object of the present invention to provide an improved signal amplifying circuit having the capability of amplifying signals down to zero frequency with broad bandwidth response.

It is another object of the present invention to provide an improved signal amplifying circuit for amplifying differential signals with a high degree of common mode rejection.

It is a further object of the present invention to provide an amplifier which combines a high differential input impedance, low output impedance and excellent gain stability.

It is a still further object of the present invention to provide a signal amplifier circuit having a high common mode input impedance so as to achieve common mode rejection while operating from a signal source which has unequal or time-varying impedances in its two output terminals.

In brief, particular arrangements in accordance with the present invention include a floating input amplifier stage in the form of a single-ended, phase-inverting amplifier with large negative feedback for high gain stabilization coupled to an impedance element. The input amplifier provides a voltage-to-current conversion so that the input signal voltage, received at virtually zero current, is made to appear as a voltage drop across the impedance element. The input amplifier and associated impedance element are coupled to an output amplifier stage which provides a current-to-voltage conversion so that the output signal available for application to a load device is a substantially amplified voltage which is truly proportional to the signal voltage at the input of the amplifier. This configuration advantageously provides impedance isolation from the input signal and substantially minimizes the response to a common mode signal source. In accordance with one aspect of the invention, band limiting modulators are not required and, hence, a wide band response may be achieved.

In one particular configuration in accordance with the invention, the amplifier comprises three single-ended floating amplifier stages, commonly known as operational amplifiers, in a circuit with two impedance elements. The impedance elements may be fixed in a particular impedance ratio, or they may be made variable with the ratio of the impedances being selected to determine the overall gain of the amplifier. In this configuration, the first of the impedance elements is connected between two of the amplifier stages which are coupled to receive respectively the input signals along the two signal conductors extending to a remote transducer or other signal source. One of the output terminals of each input amplifier stage is coupled to the common input-output terminal of the third amplifier stage (the low side thereof) while the output terminal of the remaining input amplifier stage is coupled to the remaining input terminal of the output amplifier stage. The output amplifier stage has associated with it the second impedance element coupled in a feedback path from output to input in typical operational amplifier configuration. For simplicity in understanding the principles of the invention, the impedance elements may be presented as resistors; however, any combination of resistors, capacitors and inductors may be used to provide different frequency responses or to perform operational functions such as integration or differentiation within the scope of the invention.

The amplifier stages which are connected at the input of the amplifier configuration of the invention are operated as floating amplifiers; that is, the common input-output terminals thereof are isolated from ground. This is not the usual manner of operation of such a circuit and a special power supply arrangement is required in order to maintain the desired isolation from ground. Such isolation can be achieved by employing separate battery power supplies for the respective amplifier stages without any common connection between the individual batteries. This, however, is not practical from the standpoint of gentral and widespread utilization of the amplifier and therefore, in accordance with a further aspect of the invention, a particular power supply arrangement is described having the capability of operating from A.C. power line mains while providing D.C. power for the individual amplifier stages with the desired degree of isolation.

A better understanding of the present invention may be had from a consideration of the following detailed description, taken in conjunction with the accompanying drawings, wherein.

Figure 1:
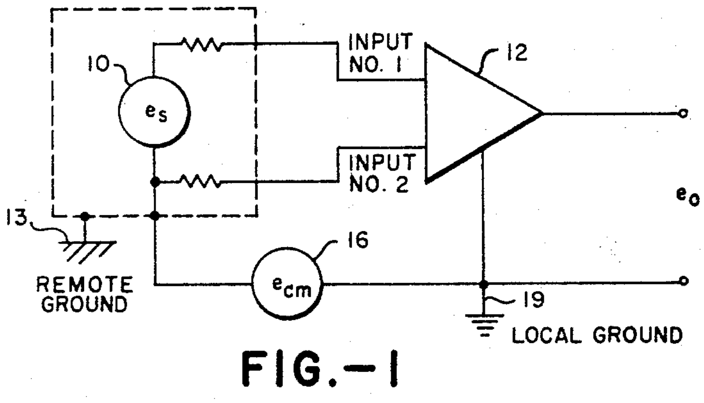
FIG. 1 is a representation of a difference type of signal amplifier circuit known in the prior art.

FIG. 1 shows one typical prior art arrangement for achieving common mode rejection in a signal amplifier arrangement. In FIG. 1, a difference amplifier 12 is shown coupled to a signal source 10 with a source 16 of common mode voltage ($e_{cm}$) coupled between the amplifier ground terminal (local ground) and a remote ground terminal at the transducer signal source ($e_s$). The difference amplifier 12 is a dual input circuit, known in the art, commonly comprising a pair of amplifying devices arranged so as to develop an output voltage which is a function of the difference of the two signal voltages applied to its dual input terminals. In this manner, the voltage from the common mode source 16 which is present in common at both of the input terminals of the amplifier 12 is intended to be cancelled out while the true signal from the signal source 10 is amplified by the amplifier 12. This principle works well as long as the impedances of the input leads and of the respective sources 10 and 16 can be maintained in appropriate ratios. However, this imposes a limitation on the circuit which is difficult to achieve in practice and which both prevents complete cancellation of the common mode voltage and also limits the useful frequency response of the circuit.

Figures 4, 7:
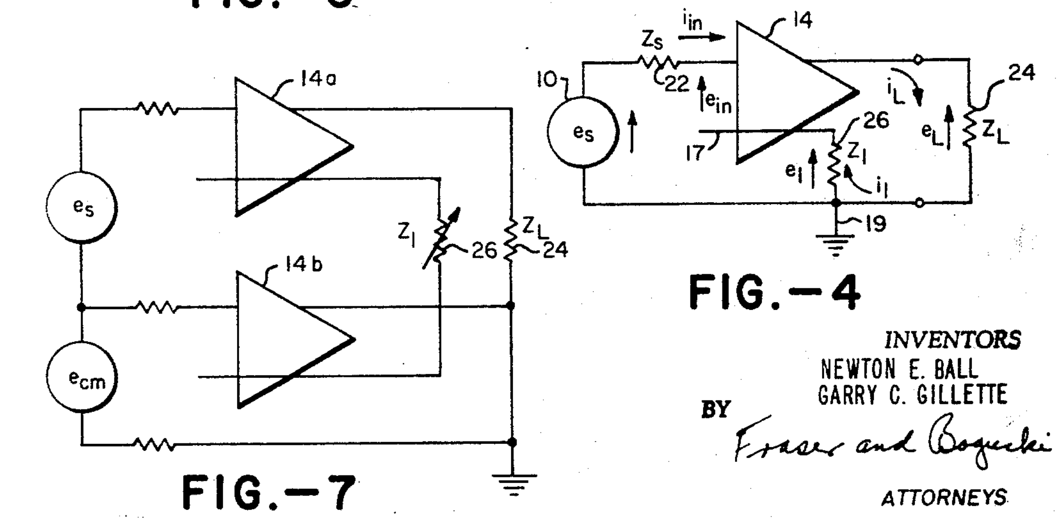
FIG. 4 is a diagram of an amplifier circuit employed in various arrangements in accordance with the present invention, presented in simplified form for purposes of illustration.
FIG. 7 is a diagram of a simplified arrangement in accordance with the invention corresponding to FIG. 6.
Figure 5:
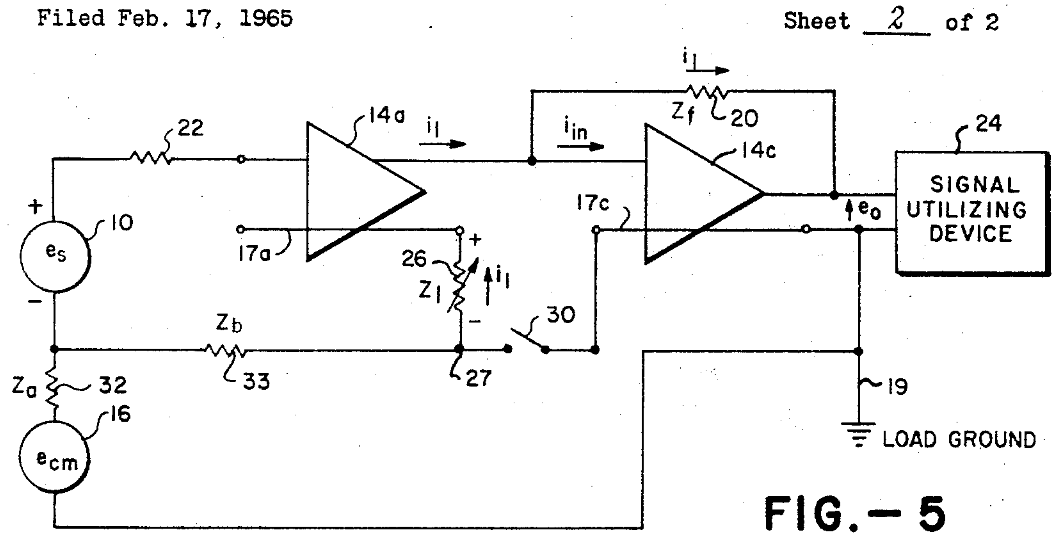
FIG. 5 is a diagram of one particular arrangement in accordance with the invention in which the circuit of FIG. 4 is employed.

Particular circuit configurations of amplifiers in accordance with the invention are represented in FIGS. 4 and 5. However, before discussing these circuits in detail, it will be helpful to examine the characteristics of simplified circuits of particular stages employed in the arrangements of the invention. In order to understand the operation of the subject invention it is desirable to understand the operation of a single-ended floating amplifier in each of several high negative feedback configurations. The term "floating," applied to the amplifier, means that its power supply is independent of any circuit point external to the amplifier and that no paths for current flow from this power source to other circuits or other amplifier exists. A simple power power source for such an amplifier is a primary cell or battery of primary cells. A more common source for such power is a transformer-isolated rectifier and filter, where the insulation and shielding between the output winding of the transformer and the primary winding provides the freedom from stray current paths that is required.

The term "single-ended" means that, for the amplifier proper, one terminal of the input is common to one terminal of the output. Diagrammatically this common terminal is drawn as a straight line through one side of the triangle symbol representing the amplifier. Historically this common terminal is often regarded as signal low side or ground. It is necessary to regard this point as an independent circuit point (not necessarily ground) in order to utilize these amplifiers in accordance with the invention.

Figures 2A, 2B, 3:
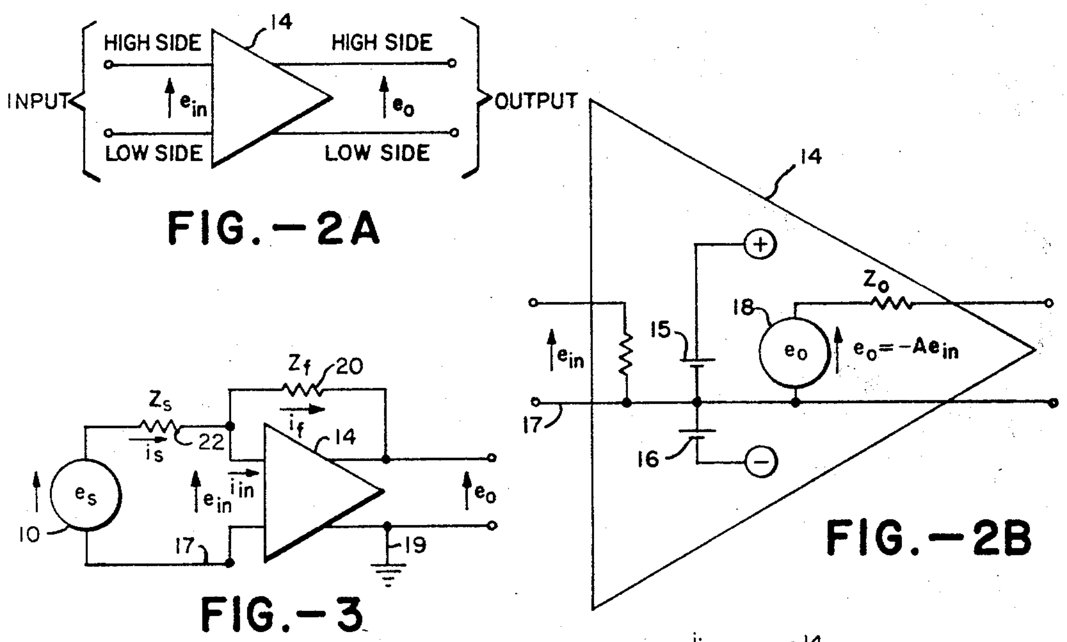
FIGS. 2A and 2B are diagrams showing the symbol and the internal transfer relationship respectively of a single-ended amplifier stage as employed in the present invention.
FIG. 3 is a diagram representing a simplified operational amplifier arrangement presented for purposes of explanation.

FIG. 2A shows a single-ended floating amplifier 14 represented by the depicted triangular symbol with the various input and output connections as described above. The arrows associated with the input voltage $e_{in}$ and the output voltage $e_o$ are employed to indicate the sense or polarity of the voltage. In accordance with convention, a positive algebraic sign is assigned to the voltage having a positive potential on the side adjacent the point of the arrow.

FIG. 2B illustrates a symbolic circuit within the amplifier 14 having internal impedances $Z_{in}$ and $Z_o$ with a transfer characteristics corresponding to the expression $e_o=-Ae_{in}$, where $-A$ is the gain of the amplifier 14. Also shown are two batteries 15 and 16 connected to a common input-output terminal 17 of the amplifier 14 and arranged to supply power to the active circuits of the amplifier. Note that the entire circuit, by virtue of the power supply connection to the common terminal 17, is referenced thereto.

The functioning of a single-ended floating amplifier in open loop connection as shown in FIG. 2B (without any negative feedback network connected) may be considered as requiring an output signal generator 18 to produce an output voltage $e_o$ of opposite sense to the input and of magnitude which is greater by the amplification factor A in accordance with the expression $$e_o=-Ae_{in} \quad (1)$$

The necessary power is drawn from the floating power supplies 15 and 16 whose common terminal is also the common output-input terminal 17. This output voltage $e_o$ is presented to the output terminals of the amplifier 14 through the open loop output impedance $Z_o$.

Such a circuit as is represented in FIGS. 2A and 2B may be coupled in various configurations and with different feedback connections. A typical configuration with a conventional feedback connection is shown in FIG. 3 in which an amplifier 14 as described is connected as an operational amplifier. A feedback impedance 20 ($Z_f$) is connected from output to input and a series input impedance 22 ($Z_s$), which may be the source impedance, completes the connection to a signal source 10 ($e_s$). A ground 19 is arbitrarily shown connected to the common terminal 17, but is not essential. Such an operational amplifier is well known in the art and is discussed for example, at page 340 ff. of "Electronic Fundamentals and Applications," 2nd edition, by John D. Ryder, published by Prentice-Hall (1959). In brief, taking the usual assumption that the forward gain A is arbitrarily high, the action of the amplifier 14 is always to reduce the input current and voltage, $i_{in}$ and $e_{in}$, to very nearly zero so that $$i_f=i_s \quad (2)$$

and $$e_o=-i_sZ_f \quad (3)$$

where $i_f$ is the feedback current and $i_s$ is the signal source current. The output amplifier stages of arrangements in accordance with the invention shown in FIGS. 5 and 6 function in this manner. The tendency of the amplifier to always reduce $e_{in}$ and $i_{in}$ to zero is present in this and all other negative feedback connections of the single-ended floating amplifier.

FIG. 4 is a second negative feedback connection of the single ended floating amplifier. As shown in FIG. 4 the common input-output terminal 17 of the amplifier proper is not a terminal either of the signal source 10 or of the load impedance 24 ($Z_L$), but rather is coupled through an impedance 26 ($Z_l$) to a common connection of the circuit again arbitrarily grounded. However, the action of the amplifier 14, given arbitrarily high gain, is to reduce $e_{in}$ and $i_{in}$ to very nearly zero. In doing this it causes $e_l$ to approximate $e_s$ and causes $i_l$ to approximately equal $i_L$. The amplifier 14 will produce the same current $i_L$ regardless of the value of $Z_L$ (within the voltage and current capabilities of its output stage). Thus, unlike the first connection, it has a very high, rather than a very low, output impedance and therefore approaches the performance of an ideal current source.

Figure 6:
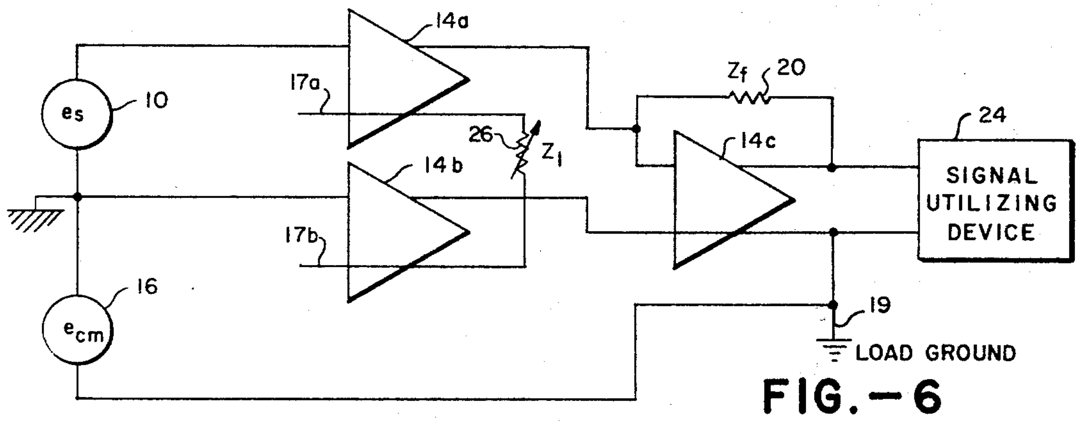
FIG. 6 is a diagram of another particular arrangement in accordance with the invention.

Amplifiers **14*a* and 14*b* in the arrangements of FIGS. 5 and 6 function in the manner of the amplifier 14 in the connection of FIG. 4. The application of the circuit of FIG. 4 to a signalling system subject to a common mode voltage source is shown in FIG. 5. FIG. 5 shows in schematic form a particular amplifier 14*c* in an operational amplifier configuration having a grounded signal utilizing means 24 and with its respective constituent elements arranged to cooperate substantially the same as like referenced elements of FIG. 3. In addition, however, there is further provided a floated, single-ended input amplifier 14*a* interposed between the output of a signal source 10 and the corresponding input of the operational amplifier 14*c*. A common impedance 26 interconnects the common terminal 17*a* (of amplifier 14*a*) with a common input terminal 27 of the overall configuration in the manner of the circuit of FIG. 4. A switch 30 is connected to the common input terminal 27 to complete a connection to the common output terminal 17*c*** and serves to permit operation of the depicted circuit under two different modes.

In normal operation of the embodiment of FIG. 5, the input signal potential $e_s$ is developed across the impedance 26 in the manner explained in connection with the description of the device of FIG. 4. The amplifier **14*a* develops an output current $i_l$ as described which flows in the circuit of amplifier 14*c* to the signal utilizing device 24 (the load impedance $Z_L$ of FIG. 4). However, as already explained, the current $i_{in}$ actually flowing into the amplifier 14*c* is maintained at substantially zero during normal operation of the amplifier. Accordingly, the output current $i_l$ of the floated amplifier 14*a* becomes the current $i_l$ flowing through the impedance 20 as the feedback current $i_f$ of the amplifier 14C (refer to FIG. 3) and the output voltage $e_o$ is thereby proportional to the current $i_l$. With the switch 30 open, as shown, the current $i_l$ returns through the common mode source 16, whereas with the switch closed, $i_1$ is provided with a direct return path to the amplifier between the common terminal 27 and 17**c.

Neglecting for the moment the common mode voltage source 16 and the series impedances 32 and 33, and with the switch 30 closed, the current $i_1$, flowing in common through $Z_1$ and $Z_f$ (the impedances 26 and 20), establishes that the ratio of the respective voltage drops is equal to the ratio of the impedances.

$$i_1 Z_f / i_1 Z_1 = Z_f / Z_1 \quad (4)$$

By reference to Equations 1 and 3 it will be appreciated that the voltage gain of the system is equal to the ratio of the feedback impedance 20 to the common impedance 26, the gain increasing as the impedance of the element 26 is decreased. To show this effect, the impedance 26 is indicated as a variable resistance element. Thus, in accordance with an aspect of the invention, the gain of the circuit of FIG. 5 may be readily controlled by adjusting the variable resistor 26.

As was demonstrated in conjunction with the circuit of FIG. 4, corresponding to the input portion of the arrangement of FIG. 5, the current flowing through the signal source 10 to the input terminal of the amplifier 14a is maintained substantially zero. Thus the impedance 22 is of negligible significance. At the same time, the current $i_1$ flowing through the impedance 26 is maintained at a level such that the voltage between the terminal 17a and the terminal 27 is equal to the voltage $e_s$ applied between the terminal 27 and the high side input terminal of the amplifier 14a. The only effect of the common mode voltage $e_{cm}$ is the portion thereof which is dropped across the series impedance 33 ($Z_B$). On the other hand, with the switch 30 open, the current $i_1$ is forced to traverse the loop through $Z_B$ and $Z_A$. In this case, some additional common mode voltage is developed by the current $i_1$ flowing through the impedance 32 ($Z_A$). It is preferred to operate the circuit of FIG. 5 with the switch 30 closed, but this is not always possible with all types of signal sources and associated amplifiers. The depicted configuration (switch 30 open) is useful as a differential amplifier, but its gain differs from that of Equation 4 for the case with switch 30 closed and is equal to $$A = \frac{Z_f}{Z_1 + Z_B} \quad (5)$$

and may vary with $Z_B$. However common mode rejection results from the fact that the voltage $e_s$ from the signal source 10 is amplified by the amplifier 14a, whereas the voltage $e_{cm}$ from the common mode source 16 does not receive amplification by the amplifier 14a.

FIG. 6 illustrates a preferred embodiment of the invention which provides improved common mode rejection over the circuit of FIG. 5. FIG. 6 shows a pair of input amplifiers 14a and 14b of the type shown in FIG. 4 which together comprise differential amplifying means for amplifying a predetermined input signal without amplification of a corresponding common mode voltage. The input amplifiers 14a and 14b are coupled to opposite sides of a signal source 10 and in series with a common impedance 26. Furthermore the amplifiers 14a and 14b are coupled to drive a grounded third amplifier 14c, of the type shown in FIG. 3, which has a signal utilizing device 24 connected across its output.

Each of the three amplifiers, 14a, 14b and 14c, acts at its feedback path in such a way as to produce zero voltage and zero current at its input terminals. This is to say that this is a negative feedback configuration for each of the amplifiers. Each of the amplifiers 14a, 14b and 14c has its own independent power supplies which have no stray current paths to each other or to any other circuit point. This implies each of the amplifiers is an independent single-ended floating amplifier.

Because the amplifiers 14a and 14b operate to maintain the voltage and current at their respective inputs substantially at zero, there are no voltage drops in the input leads and all of the signal voltage $e_s$ is developed across the common impedance 26 with no possibilty of amplifying any component of the common mode voltage $e_{cm}$ or of applying even an unamplified component to the load circuit. To emphasize this advantageous result, the lead impedances have been omitted from FIG. 6.

It will be seen that the configuration thus exhibits high common mode rejection regardless of source impedance or degree of unbalance of the source impedance. Moreover, the provision of the common impedance 26 as a variable resistor (in those cases where both $Z_1$ and $Z_f$ are resistors) permits a ready adjustment of the gain setting for the amplifier without the need for complicated balancing techniques as in the case of prior art circuits employing bridge configurations.

A somewhat simplified arrangement of the amplifier of FIG. 6 is shown in FIG. 7. This utilizes the same input amplifiers 14a and 14b but eliminates the amplifier 14c and instead applies current directly to a load impedance 24 ($Z_L$). This configuration has all of the desirable characteristics of the FIG. 6 amplifier except that its output impedance is very high, rather than being very low as with the FIG. 6 amplifier. The circuit of FIG. 7 may be considered a current source (for the load $Z_L$) providing a current of magnitude $e_s/Z_1$ independent of $e_{cm}$ and independent of $Z_L$ (within the limits of operation of the circuit).

The above described particular arrangements in accordance with the invention involving one or more floated, phase-inverting amplifiers, such as amplifiers 14a and 14b, require the provision of floated power supplies associated therewith in order to avoid providing any ground connection to the common input-output terminals of the respective amplifiers. While a floating power supply can readily be provided by the use of batteries, this is not the most desirable arrangement in view of the limited life of batteries and other limitations. One particular arrangement in accordance with a further aspect of the invention for providing dual floated power supplies to separately drive the amplifiers 14a and 14b of FIGS. 6 and 7 is shown schematically in FIG. 8. In this particular arrangement, a power transformer 42 is provided having a primary winding 44 and a pair of secondary windings 45 and 46 for conversion of the line voltage to voltages which are suitable for powering amplifiers 14a and 14b. The circuit of the primary winding 44 may be grounded as shown and is further provided with a switch 43 for on-off control. The secondary winding 45 is associated with the amplifier 14a and is shown coupled to a rectifier 48 which in turn is coupled to a filter 50, the output of which is applied to suitable terminals of the amplifier 14a. The secondary winding 46 is similarly coupled to a rectifier 52 and a filter 53 and is part of the power supply for the amplifier 14b. Although the primary winding 44 is grounded, it will be noted that there is no ground connection whatsoever to either of the secondary windings 45 and 46 or their associated separate power supplies.

Figure 8:
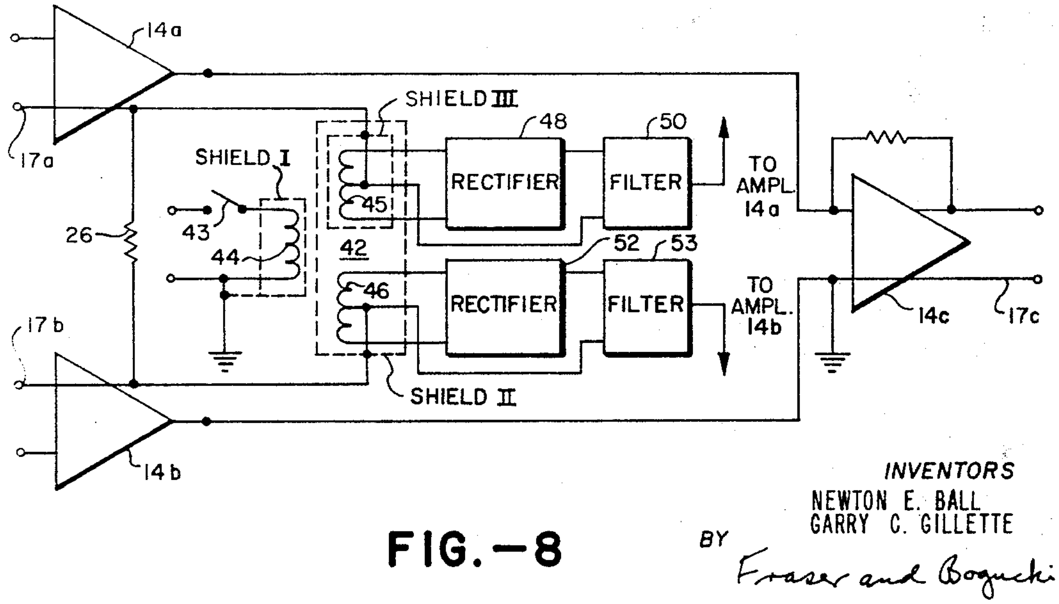
FIG. 8 is a diagram of still another arrangement in accordance with the invention representing a preferred power supply configuration for the circuits of FIGS. 6 and 7.

The particular arrangements of the shields which are provided to eliminate the capacitive coupling effects between the respective windings of the transformer 42 (and thereby to ground) may be provided as shown in FIG. 8. The respective shields are represented by the broken lines therein. The first shield I is shown encompassing the primary winding 44 and is electrically connected to ground. A second shield II is shown encompassing both of the secondary windings 45 and 46 and is electrically connected to a common point of the power supply for the amplifier 14b which is coupled to the common input-output terminal 17b of the amplifier 14b. A third shield III is shown within the shield II and encompassing only the secondary winding 45 of the power supply for the amplifier 14a. The shield III is electrically connected to a common point of the power supply for the amplifier 14a and is connected to the common input-output terminal 17a of the amplifier 14*a*. By virtue of this particular arrangement in accordance with the invention, the amplifiers 14*a* and 14*b* are permitted to float without there being any ground connection through their respective associated power supplies. In this arrangement, the capacitive current of the shield III passes through the common input impedance 26, but this is the smallest of the respective shields and thus the effects of this capacitive current are minimized. It may be mentioned, that the power supply for the output amplifier 14*c* is not shown in FIG. 8, but it will be understood that a conventional grounded power supply may be employed since the common input-output terminal 17*c* of the amplifier 14*c* is itself grounded.

By virtue of the above-described arrangements in accordance with the present invention involving one or more floated single ended amplifiers as input amplifiers of the differential amplifier circuit, a signal amplifying system may be provided having suitable gain for amplification of a preferred signal with a high degree of rejection for any common mode voltages which may appear. This high common mode rejection is achieved without the necessity for the use of resistors or other components that have to be matched to close tolerances, without the need for guard shields being driven by an external source, and without the inherent limitations in band width which are present in various prior art arrangements. The particular configurations in accordance with the invention which employ a pair of floated input amplifiers to reject common mode voltages exhibit an extremely high impedance to differential input signals and, where the two input amplifiers have similar zero drift characteristics, these zero drift characteristics advantageously tend to cancel each other. In addition, a particular power supply arrangement is provided for use with the floated input amplifiers in order that the amplifiers may be operated with truly separate floating power supplies.

What is claimed:

1. A differential amplifier for amplifying selected signals in a frequency range extending to zero frequency with high common mode rejection comprising at least one floating, single ended amplifier stage having high side and low side input and output terminals with the low side terminals for the input and output being connected together, a common impedance connected at one end to the low side input-output terminal of the amplifier stage, the low side input-output terminals being otherwise isolated from any signal path, a source of input signals to be amplified connected to the high side input terminal of the amplifier stage and to the end of the common input impedance which is remote from the amplifier stage, a second amplifier stage connected in an operational amplifier configuration having a first input terminal coupled to the high side output terminal of the first amplifier stage and a second input terminal coupled to said remote end of said common impedance, and means for applying the output from the second amplifier stage to a signal utilizing device.

2. A differential amplifier in accordance with claim 1 further including a two-position switch connecting the second input terminal of the second amplifier stage to said remote end of the common impedance.

3. A differential amplifier in accordance with claim 1 wherein the second input terminal of the second amplifier stage is coupled to the remote end of the common impedance through a source of common mode voltage.

4. A differential amplifier in accordance with claim 1 wherein the second input terminal of the second amplifier stage is electrically connected directly to said remote end of the common impedance.

5. A differential amplifying circuit for amplifying predetermined signals within a frequency range extending to zero frequency with high common mode rejection comprising a pair of floating, single ended amplifier stages each having high side and low side input and output terminals, means for coupling a source of said predetermined signals across the high side input terminals of the two amplifier stages, first coupling means connecting the low side input and output terminals of one amplifier stage together as a first common input-output terminal, second coupling means connecting the low side input and output terminals of the other amplifier stage together as a second common input-output terminal, a common impedance connected between the respective common low side input-output terminals of the two amplifier stages, each of the common low side input-output terminals being otherwise isolated from any signal path, and a signal utilizing device coupled across the high side output terminals of the two amplifier stages.

6. A differential amplifying circuit in accordance with claim 5 further including means coupling the signal utilizing device across the high side output terminals comprising an amplifier stage connected as an operational amplifier and having a feedback impedance coupled from input to output thereof, said operational amplifier having its input terminals connected respectively to the high side output terminals of the two input amplifiers, whereby the gain of the differential amplifying circuit is determined by the ratio of the feedback impedance to the common impedance.

7. A differential amplifying circuit in accordance with claim 6 wherein said common impedance is variable in order to adjust the gain of the amplifying circuit.

8. A differential amplifier arrangement for amplifying predetermined signals within a frequency range including zero frequency with a high common mode rejection comprising a pair of floating single-ended amplifier stages in a symmetrical configuration, each of said amplifier stages having high side and low side input and output terminals and power supply terminals, the low side input and output terminals of each amplifier being commonly connected to each other, a common impedance connected between the low side terminals of the two amplifiers, the low side terminals being otherwise isolated from any signal path, means for applying predetermined signals to the high side input terminals of the two amplifiers, means for coupling a signal utilizing device across the high side output terminals of the two amplifier stages, and means for supplying operating potentials to the respective power supply terminals of the amplifier stages while maintaining said amplifier stages isolated from a common reference potential and from each other comprising a pair of distinct rectifiers supplied from respective secondary windings of a common transformer and means for individually shielding the respective windings of said transformer.

9. A differential amplifier arrangement in accordance with claim 8 wherein said shielding means comprises a first shield associated with the primary winding of the transformer and being connected to a ground reference point, a second shield extending about both secondary windings and being connected to the low side terminal of the second amplifier stage, and a third shield extending about a first secondary winding inside the second shield and being connected to the low side terminal of the first amplifier stage.

References Cited

UNITED STATES PATENTS

| | | | |
|---|---|---|---|
| 2,977,547 | 3/1961 | Talambiras | 330—69 |
| 3,196,364 | 7/1965 | Latham | 330—69 X |
| 3,204,193 | 8/1965 | Rhyne | 330—69 X |
| 3,209,277 | 9/1965 | Burwen | 330—69 |
| 3,289,094 | 11/1966 | Young | 330—69 |

NATHAN KAUFMAN, *Primary Examiner.*

U.S. Cl. X.R.

330—51, 68